United States Patent
Singh et al.

(10) Patent No.: US 9,349,718 B2
(45) Date of Patent: May 24, 2016

(54) ESD SNAPBACK BASED CLAMP FOR FINFET

(71) Applicant: GLOBALFOUNDRIES Inc., Grand Cayman (KY)

(72) Inventors: Jagar Singh, Clifton Park, NY (US); Andy Wei, Queensbury, NY (US); Mahadeva Iyer Natarajan, Clifton Park, NY (US); Manjunatha Prabhu, Malta, NY (US); Anil Kumar, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/469,155

(22) Filed: Aug. 26, 2014

(65) Prior Publication Data

US 2016/0064372 A1  Mar. 3, 2016

(51) Int. Cl.
*H01L 27/02* (2006.01)
*H01L 29/78* (2006.01)
*H01L 29/66* (2006.01)

(52) U.S. Cl.
CPC ...... *H01L 27/0266* (2013.01); *H01L 29/66477* (2013.01); *H01L 29/78* (2013.01)

(58) Field of Classification Search
CPC ................ H01L 27/0266; H01L 29/78; H01L 29/66477
See application file for complete search history.

(56) References Cited

U.S. PATENT DOCUMENTS

| | | | | |
|---|---|---|---|---|
| 6,110,787 A | * | 8/2000 | Chan | ................. H01L 21/76224 257/E21.43 |
| 6,521,952 B1 | * | 2/2003 | Ker | ..................... H01L 27/0262 257/141 |

* cited by examiner

*Primary Examiner* — David Vu
(74) *Attorney, Agent, or Firm* — Heslin Rothenberg Farley & Mesiti P.C.; Kristian E. Ziegler

(57) ABSTRACT

There is set forth herein a field effect transistor (FET) configured as an ESD protection device. In one embodiment, the FET can be configured to operate in a snapback operating mode. The FET can include a semiconductor substrate, a gate formed on the substrate and a dummy gate formed on the substrate spaced apart from the gate.

20 Claims, 9 Drawing Sheets

ESD SNAPBACK BASED CLAMP FOR FINFET

FIELD

There is set forth herein a semiconductor device, and more particularly a semiconductor device featured for avoiding current surge failure.

BACKGROUND

High transient currents during electrostatic discharge (ESD) events can cause damage to core circuits. For protection of core circuits, ESD protection devices can be employed to clamp voltages applied to core circuits to safe, low levels. ESD protection devices can include, e.g., diodes and field effect transistors (FETs).

According to a first approach for ESD protection, an ESD protection device is arranged to operate in a simple turn on mode during an ESD event. At a turn on voltage, voltage across the ESD protection device can be clamped, and the protection device forms a low impedance shunt channel to discharge ESD transients. Current handling ability can be limited by heat generation due to series resistance in the shunting channel. The turn on clamping voltage should be selected to be low enough for protection of a core circuit being protected, but high enough above an operating voltage so as to avoid unintended operation.

According to a second approach for ESD protection, an ESD protection device can be arranged to operate according to a snapback mode of operation during an ESD event. In one example, a FET can be employed to provided snapback mode ESD protection. A FET can define a parasitic bipolar junction transistor (BJT) with a drain defining a parasitic BJT collector, the substrate defining a parasitic BJT base, and the source defining a parasitic BJT emitter. Snapback mode ESD protection can rely on operation of a parasitic BJT transistor defined by a FET.

An ESD protection device can include a first breakdown voltage, known as a triggering voltage, a holding voltage and a second breakdown voltage. An ESD protection device can be designed so that during an ESD event, voltages across the ESD protection device are within a protection region between the holding voltage and the second breakdown voltage.

A FET employed for ESD protection can include a drain (collector) connected to a core circuit I/O contact and a source (emitter) connected to ground. At small ESD voltages, the drain-substrate (collector-base) junction can be reverse biased. As ESD voltages are increased, the first breakdown voltage will be reached. At the first breakdown voltage, known as an avalanche breakdown, there will be a free avalanche of holes/electrons across the drain-substrate (collector-base) junction.

With a reverse bias current flowing into the substrate (base) the parasitic BJT transistor defined by the FET can turn on to discharge the ESD current though a current path from the drain through the substrate to the source (operating as a BJT collector, base and emitter respectively).

Implementing ESD solutions in integrated circuits is always challenging. In one aspect reduced sizes of integrated circuits impose increasing challenges to design of ESD discharge current handling ability of ESD protection devices. Proposals have been made for tuning of ESD snapback operating mode characteristics of an ESD protection device using a drain of special configuration, referred to as an extended drain. However, in integrated circuits, there are significant challenges to realizing extended drain ESD protection devices given that device structure sizes and spacing distances often cannot be varied without costly variations of process flow.

BRIEF DESCRIPTION

There is set forth herein a field effect transistor (FET) configured as an ESD protection device. In one embodiment, the FET can be configured to operate in a snapback operating mode. The FET can include a semiconductor substrate, a gate formed on the substrate and a dummy gate formed on the substrate spaced apart from the gate. The FET can include a source diffusion region adjacent a first end of the gate, and a first drain diffusion region formed intermediate of the gate and the dummy gate. The first drain diffusion region can be adjacent to a second end of the gate and a first end of the dummy gate. The FET can include a second drain diffusion region, the second drain diffusion region spaced apart from the first drain diffusion region. The FET can include a contact configured for connection to a core circuit I/O contact. The contact can be in electrical communication with the second drain diffusion region.

BRIEF DESCRIPTION OF THE SEVERAL VIEWS OF THE DRAWINGS

One or more aspects as set forth herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
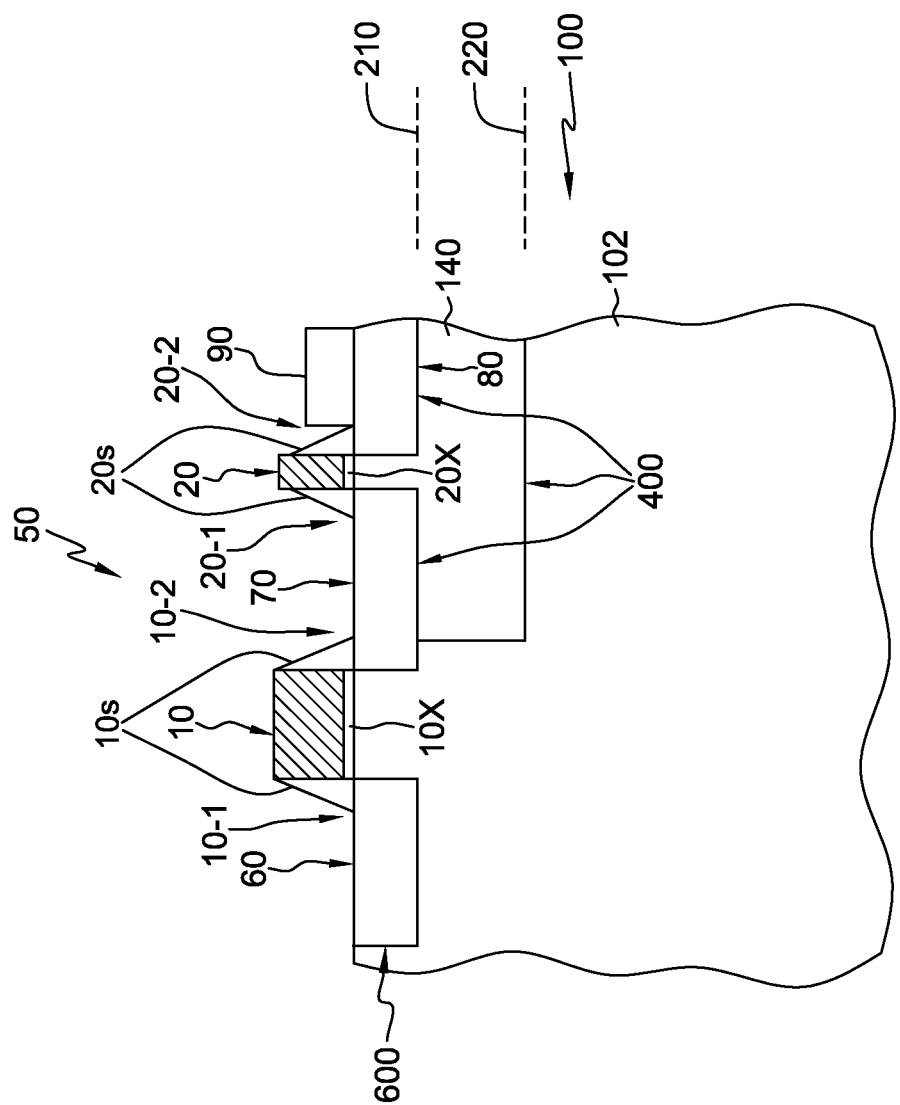
FIG. 1 is a cross sectional view of a semiconductor device having a field effect transistor.

With reference to FIG. 1, there is set forth herein a semiconductor device 100 including a field effect transistor (FET) 50 configured as an ESD protection device. The FET 50 can include a semiconductor substrate 102, a gate 10 formed on the substrate 102 and a dummy gate 20 formed on the substrate 102 spaced apart from the gate 10. The FET 50 can include a source diffusion region 60 formed in the substrate 102 adjacent a first end 10-1 of the gate 10, and a first drain diffusion region 70 formed in the substrate 102 intermediate of the gate 10 and the dummy gate 20. The first drain diffusion region 70 can be adjacent to a second end 10-2 of the gate 10 and a first end 20-1 of the dummy gate 20. The FET 50 can include a second drain diffusion region 80 formed in the substrate 102, the second drain diffusion region 80 spaced apart from the first drain diffusion region 70.

A drain of FET 50 in one embodiment can include a first drain diffusion region 70 and a second drain diffusion region 70. Features of a drain set forth herein can define an extended drain ESD protection device.

The FET 50 can include a contact 90 configured for connection to a core circuit I/O contact. A voltage applied to core circuit I/O contact can be a control voltage, or in the case of an ESD event, an ESD event voltage. The contact 90 can be aligned to second drain diffusion region 80. The contact 90 can be formed on second drain diffusion region 80 and can be electrically connected to second drain diffusion region 80.

In the embodiment of FIG. 1, the dummy gate 20 includes a first end 20-1 and a second end 20-2. First drain diffusion region 70 can be disposed adjacent the first end 20-1 of dummy gate 20, and the first drain diffusion region 70 can be disposed adjacent a second end 10-2 of gate 10.

Figure 2:
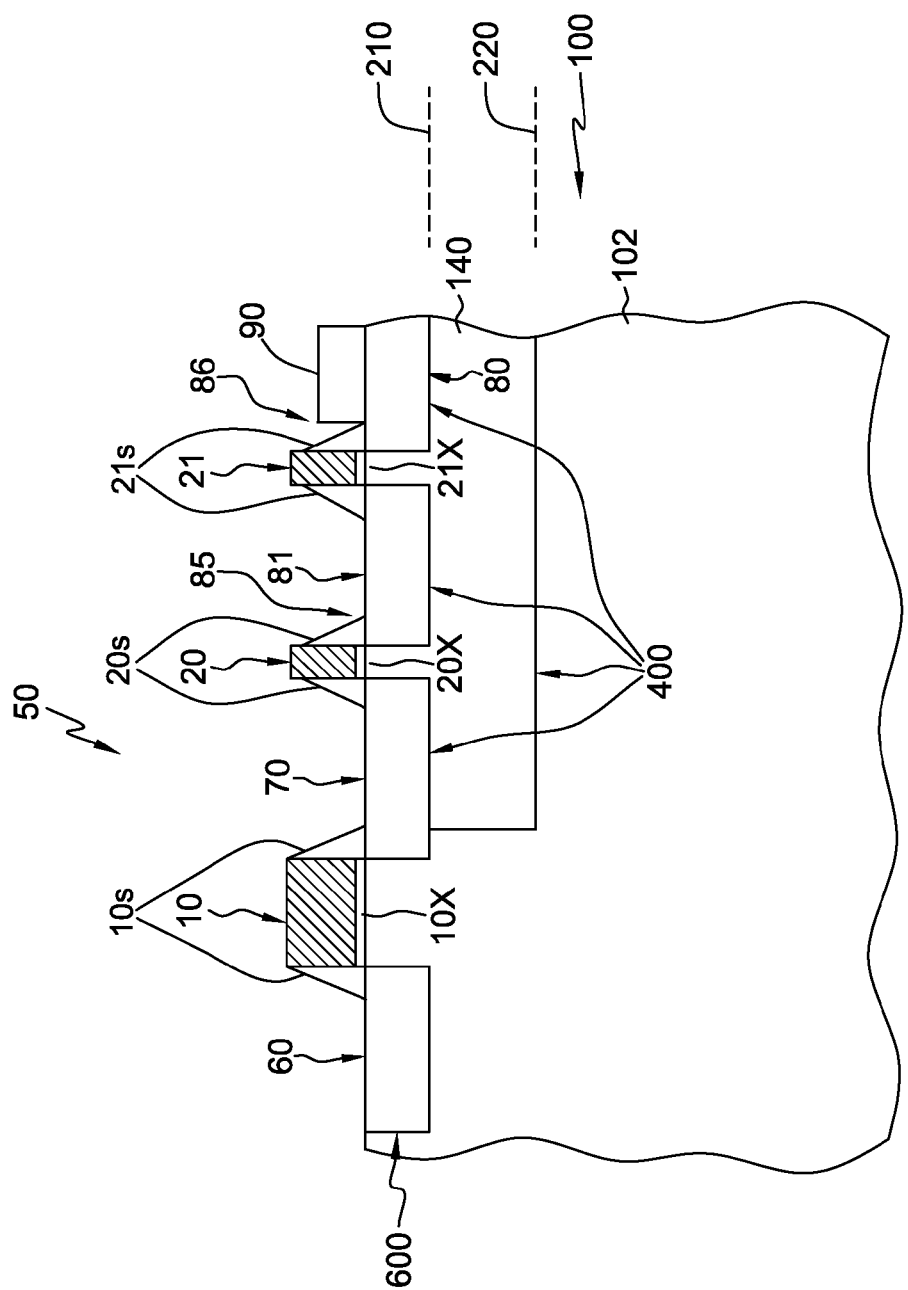
FIG. 2 is a cross sectional view of a semiconductor device having a field effect transistor.

Referring to FIG. 2, FET 50 as shown in the embodiment of FIG. 2 can include an arrangement of an additional drain diffusion region 81 and an additional dummy gate 21, the arrangement having a first end 85 and a second end 86, the first end disposed adjacent the dummy gate 20, the second end disposed adjacent the second drain diffusion region 80.

Figure 3:
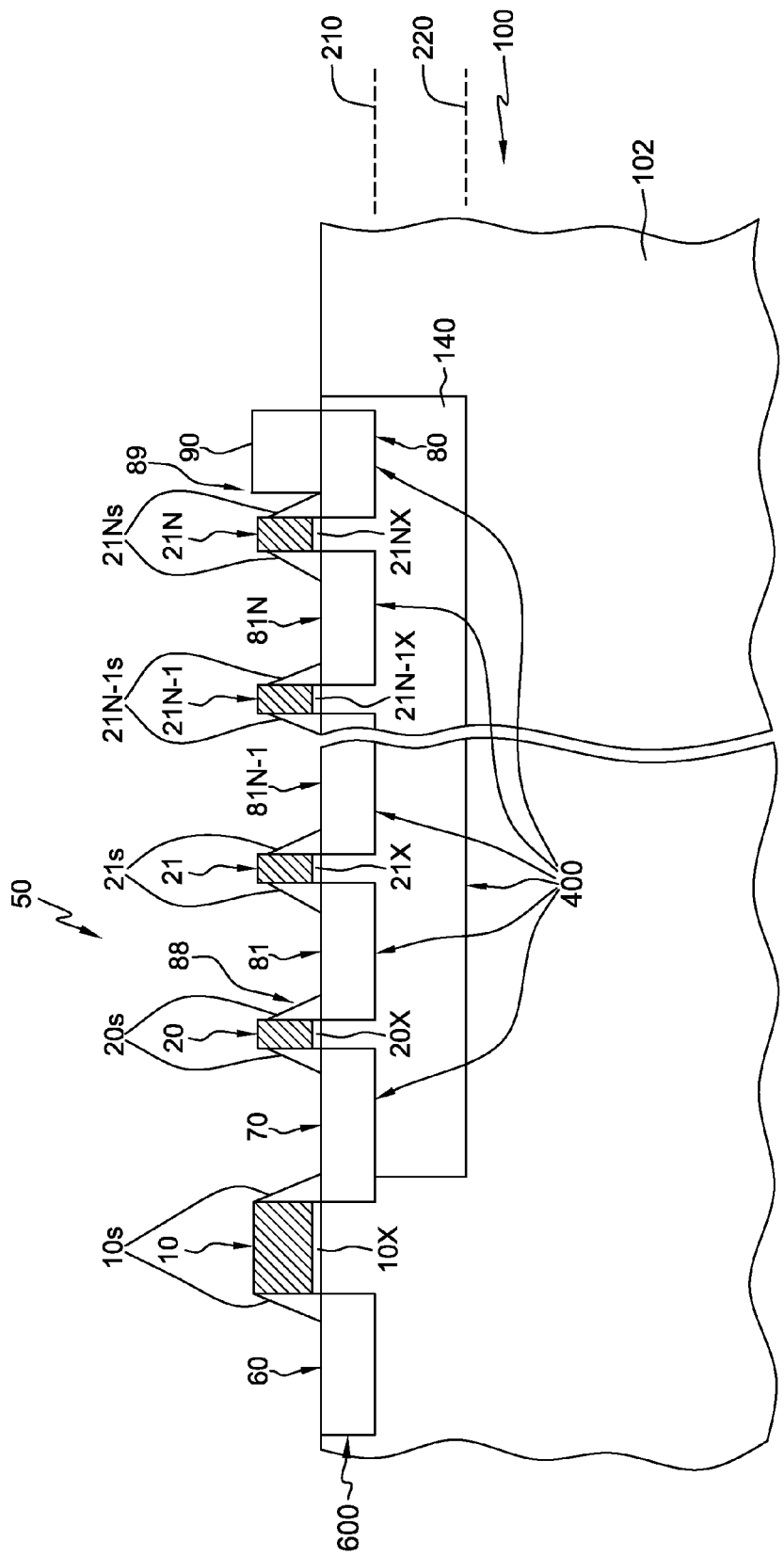
FIG. 3 is a cross sectional view of a semiconductor device having a field effect transistor.

Referring to FIG. 3, FET 50 as shown in the embodiment of FIG. 3 can include an arrangement of a plurality of additional drain diffusions 81, 81N-1, 81N and a plurality of additional dummy gates 21, 21N-1, 21N. In the embodiment as shown in FIG. 3, each additional drain diffusion region of the plurality of additional drain diffusion regions can be disposed adjacent to one additional dummy gate of the plurality of additional dummy gates 21N-1, 21N. Referring to the embodiment of FIG. 3, the arrangement of a plurality of additional drain diffusion regions and a plurality of additional dummy gates can have a first end 88 and a second end 89. The first end 88 of such arrangement can be disposed adjacent the dummy gate 20. The second end 89 of such arrangement can be disposed adjacent the second drain diffusion region 80.

Referring to FIGS. 1-3, FET 50 can include a doped region 140 connecting the drain diffusion region 70 and the second drain diffusion region 80. Doped region 140 can include a polarity in common with a polarity of source diffusion region 60 first drain diffusion region 70 and second drain diffusion region 80. In one embodiment, source diffusion region 60 first drain diffusion region 70 and second drain diffusion region 80 can be N doped diffusion regions and doped region 140 can also be N doped. Doped region 140 can be operative to merge first drain diffusion region 70 second drain diffusion region 80 and any additional diffusion regions of FET 50.

In one embodiment, doped region 140 can include a well doping area formed by well doping of substrate 102.

In one embodiment, doped region 140 can include a halos implant area formed by halos implant doping of substrate 102.

In one embodiment, doped region 140 can include an extensions implant area formed by extensions implant doping of substrate 102.

In one embodiment, doped region 140 can include first and second doping areas of different types. Each of the first and second doping areas can be a doping area selected from the group consisting of a well doping area formed by well doping of substrate 102, a halos doping area formed by halos implant doping of substrate 102, and an extensions implant doping area formed by extensions implant doping of substrate 102. The doping areas of different types can be discontinuous doping areas or continuous doping areas.

In one embodiment, doped region 140 can include first second and third doping areas of different types. Each of the first second and third doping areas can be a doping area selected from the group consisting of a well doping area formed by well doping of substrate 102, a halos doping area formed by halos implant doping of substrate 102, and an extensions implant doping area formed by extensions implant doping of substrate 102. The doping areas of different types can be discontinuous doping areas or continuous doping areas.

Figure 4:
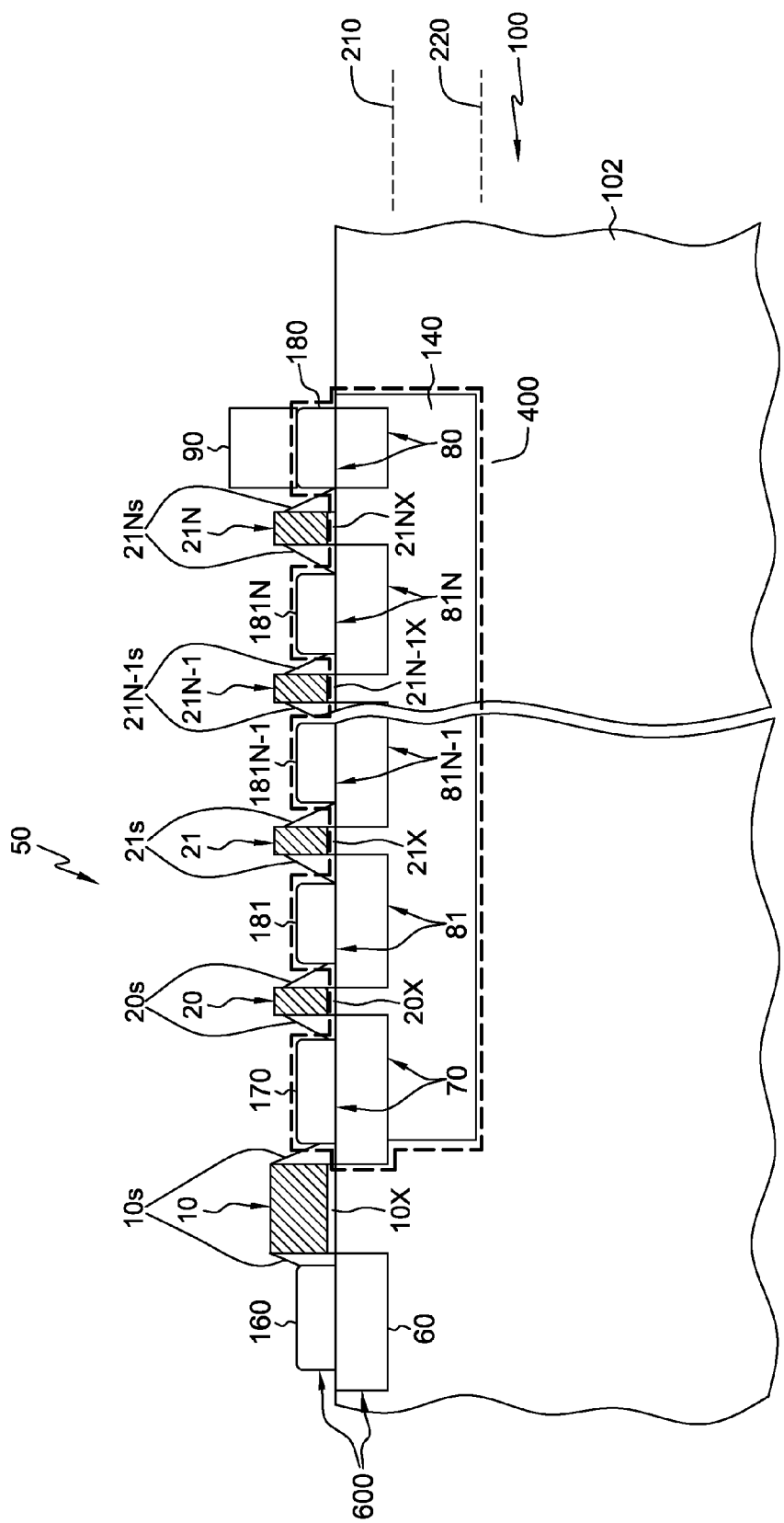
FIG. 4 is a cross sectional view of a semiconductor device having a field effect transistor.

In the embodiment of FIGS. 1-3 contact 90 can be formed on and can be electrically connected to a second drain diffusion region 80 and FET 50 can be absent of epitaxial growth formations formed on source/drain diffusion regions 60, 70, 80, 81 (FIG. 2), 81N-1 (FIG. 3), and 81N (FIG. 3). In the embodiment of FIG. 4, source/drain diffusion regions 60, 70, 80, 81 (FIG. 2), 81N-1 (FIG. 3), and 81N (FIG. 3) can be raised source/drain diffusion regions and can include epitaxial growth formation 160, 170, 180, 181N-1, and 181N formed above a top elevation of substrate 102. In the embodiment of FIG. 4, contact 90 can be formed on and can be electrically connected to second drain diffusion region 80 having epitaxial growth formation 180. Contact 90 can be aligned to second drain diffusion region 80. In the embodiment of FIG. 4, contact 90 can be electrically connected to a second drain diffusion region 80, which in the embodiment of FIG. 4 can be a raised diffusion region having epitaxial growth formation 180. In each of the embodiments of FIGS. 1-4, contact 90 can be aligned with second drain diffusion region 80.

A semiconductor device 100 as set forth herein can include a discrete semiconductor device e.g. a FET 50. A semiconductor device 100 herein can include a plurality of discrete semiconductor devices, e.g., a plurality of FETs 50. A semiconductor device 100 as set forth herein can be e.g. a semiconductor wafer or integrated circuit including a plurality of discrete semiconductor devices.

In the embodiment of FIGS. 1-3, a drain 400 (drain junction) of FET 50 is defined by a combination of each drain diffusion region of FET 50 and by doped region 140. In the embodiment of FIG. 4, a drain 400 of FET 50 is defined by a combination of each drain diffusion region of FET 50 (including each epitaxial growth formation of FET 50) and by doped region 140. In the embodiment of FIGS. 1-3 source 600 (source junction) is defined by source diffusion region 60 which can be absent an epitaxial growth formation. In the embodiment of FIG. 4, source 600 can be defined by a source diffusion region 60 having epitaxial growth formation 160. In the embodiments of FIGS. 1-3, contact 90 can be formed on and can be electrically connected to a second drain diffusion region 80 of a defined drain 400, which second drain diffusion region 80 can be absent an epitaxial growth formation. In the embodiment of FIG. 4, contact 90 can be formed on and can be electrically connected to epitaxial growth formation 180 of a defined drain 400, which epitaxial growth formation 180 can form a section of second drain diffusion region 80. Features of a drain 400 set forth herein in various embodiments can define an extended drain ESD protection device.

In one embodiment substrate 102 as depicted in FIGS. 1-4 is provided by a bulk substrate of a semiconductor device 100. In one embodiment, substrate 102 as depicted in FIGS. 1-4 is provided by a fin portion of a substrate that extends upwardly from a bulk substrate.

Referring to the embodiments of FIGS. 1-4 each gate of FET 50 can have associated spacers. In the embodiment of FIG. 1, gate 10 includes associated spacers 10S and dummy gate 20 include associated spacers 20S. In the embodiment of FIG. 2, which further includes additional dummy gate 21 additional dummy gate 21 includes spacers 21S. In the embodiments of FIGS. 3 and 4, which further include additional gates 21N-1, 21N additional gates 21N-1, 21N can include, respectively, associated spacers 21N-1S, 21NS.

Referring to the embodiments of FIGS. 1-4, each gate of FET 50 can include an associated gate oxide layer.

Referring to the embodiments of FIGS. 1-4 gate 10 can include gate oxide layer 10X and dummy gate 20 can include gate oxide layer 20X.

Referring to the embodiment of FIG. 2, dummy gate 21 can include gate oxide layer 21X.

Referring to the embodiments of FIGS. 3-4, dummy gate 21N-1 can include gate oxide layer 21N-1X, and gate dummy 21N can include gate oxide layer 21NX.

The design as set forth in any of the embodiments of FIGS. 1-4 can reduce a likelihood of damage to FET 50 resulting from a current surge in FET 50. A current surge in FET 50 can occur during an ESD event. During an ESD event, a parasitic bipolar junction transistor (BJT) defined by a drain 400, substrate 102 and source 600 of FET 50 can turn on and conduct current. Configured as an ESD protection device, FET 50 during an ESD event can operate in a snapback mode of operation. In one example, FET 50 can clamp a voltage applied to a protected core circuit by operating during an ESD event within a protection operating region (window) wherein a voltage drop across FET 50 is between a holding voltage and a second breakdown voltage.

In one aspect, features of drain 400 as set forth herein, e.g. where including one or more of a plurality of diffusion regions, (with or without a plurality epitaxial growth formations) or a doped region 140 can provide ESD ballasting. By increasing a resistance of drain 400, features of drain 400 can increase an ESD event voltage drop across drain 400, thereby decreasing an ESD event voltage drop across substrate 102. With an ESD event voltage drop across substrate 102 reduced, there is a relatively smaller current surge through FET 50 including substrate 102 during an ESD event. Consequently, there is less heating of substrate 102, and a reduced risk of thermal damage to substrate 102 and any metal or dielectric layers in contact with or in thermal communication with substrate 102.

In one example, where a contact 90 for a drain 400 of FET 50 that is electrically connected to a drain 400 of FET 50 is closely spaced to gate 10, current surge through FET 50 during an ESD event can become localized (in proximity to gate 10) and can pose a risk to various critical components of FET 50, such as gate oxide layer 10X of gate 10.

Referring to the embodiments of FIGS. 1-4, FETs 50 shown and described in FIGS. 1-4 are featured for avoiding damage to FET 50 during a current surge such as a current surge occurring during an ESD event. In the embodiments of FIGS. 1-4, contact 90 is spaced apart from gate 10 and therefore localized current surges in proximity with gate 10 can be avoided.

In the embodiment of FIGS. 1-4, contact 90 configured for connection to a core circuit contact can be spaced from gate 10 a distance of at least one drain diffusion region plus a gate length of dummy gate 20. Referring to the embodiment of FIGS. 1-4, doped region 140 which operate to merge drain diffusion regions can extend to a bottom elevation 220 below a bottom elevation 210 of drain diffusion regions of FET 50, thus encouraging current flow during an ESD event deeper into substrate 102 and further reducing an amount of current flow in proximity with gate 10.

The design of FIGS. 1-4 facilitates fabrication of FET 50 without any special layout rules or additional process masks. Drain 400 of FET 50 set forth in the embodiments of FIGS. 1-4 can be of a specialized extended configuration and can define an extended drain ESD protection device. In one aspect, the design of FIGS. 1-4 facilitates fabrication of an extended drain ESD protection device without any special layout rules or additional process masks. While providing accurate spacing for contact 90, and alleviating a need for special fabrication processing, dummy gates of FET 50 improve a capacity of gate 10 to be planarized using chemical mechanical planarization. A presence of dummy gates e.g. dummy gate 20 (FIGS. 1-4), dummy gate 21 (FIG. 2) spaced apart from dummy gate 20 improves the precision with which dummy gate 20 can be planarized, thus helping to avoid failures of FET 50, e.g. due to shorting, which may result from planarization error.

In the embodiment of FIGS. 1-4, a contact 90 can be aligned to second drain diffusion region 80 and spaced apart from dummy gate 20. An increased spacing distance (increased relative to a case where a contact is aligned to a diffusion region adjacent a gate) between a gate 10 and contact 90 can provide a variety of advantages. For example, an increased spacing distance between gate 10 and contact 90 can avoid localized current surges in proximity to gate 10 during ESD events as set forth herein. Further, an increased spacing distance between gate 10 and contact 90 can reduce capacitive coupling between contact 90 and gate 10, thus reducing a risk of harmful voltages coupling to gate 10 by way of capacitive coupling. In addition, an increased spacing distance between gate 10 and contact 90 can define an increased length for doped region 140 that merges two or more drain diffusion regions.

With a defined drain resistance of drain 400 increased, drain 400 can provide ESD ballasting. With a resistance of drain 400 increased, an ESD event voltage drop across drain 400 can be increased relative to an ESD event voltage drop across substrate 102. Accordingly, current surges through substrate 102 of FET 50 during an ESD event can be reduced to lower levels, reducing a likelihood of thermal damage to substrate 102 and materials in contact with substrate 102 during an ESD event.

Figure 5:
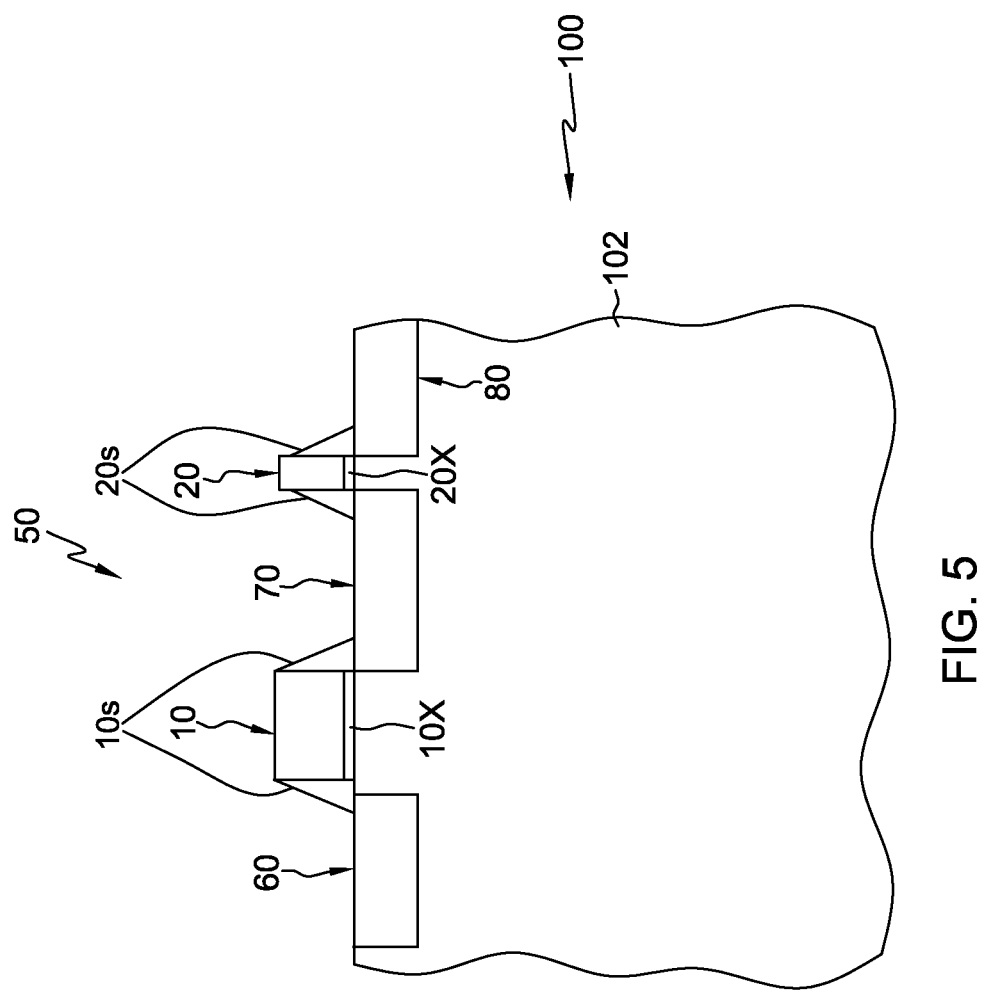
FIG. 5 is a cross sectional view of a semiconductor device having a field effect transistor in an intermediary stage of fabrication.

A method for fabrication of FET 50 as shown in FIG. 1 using a gate last fabrication process is set forth in reference to FIGS. 5-8. Referring to FIG. 5, FIG. 5 illustrates a patterning of gate 10, dummy gate 20, source diffusion region 60, first drain diffusion region 70 and second drain diffusion region 80. In the intermediary stage of fabrication depicted in FIG. 5, gate 10 and dummy gate 20 can be in sacrificial gate form and can include polysilicon. Gate 10 and dummy gate 20 can include respective spacers 10s and 20s which facilitate fabrication of a replacement metalized gate. Gate 10 and dummy gate 20 in sacrificial gate form can be patterned contemporaneously with a patterning of source diffusion region 60, drain diffusion region 70 and second drain diffusion region 80.

Figure 6:
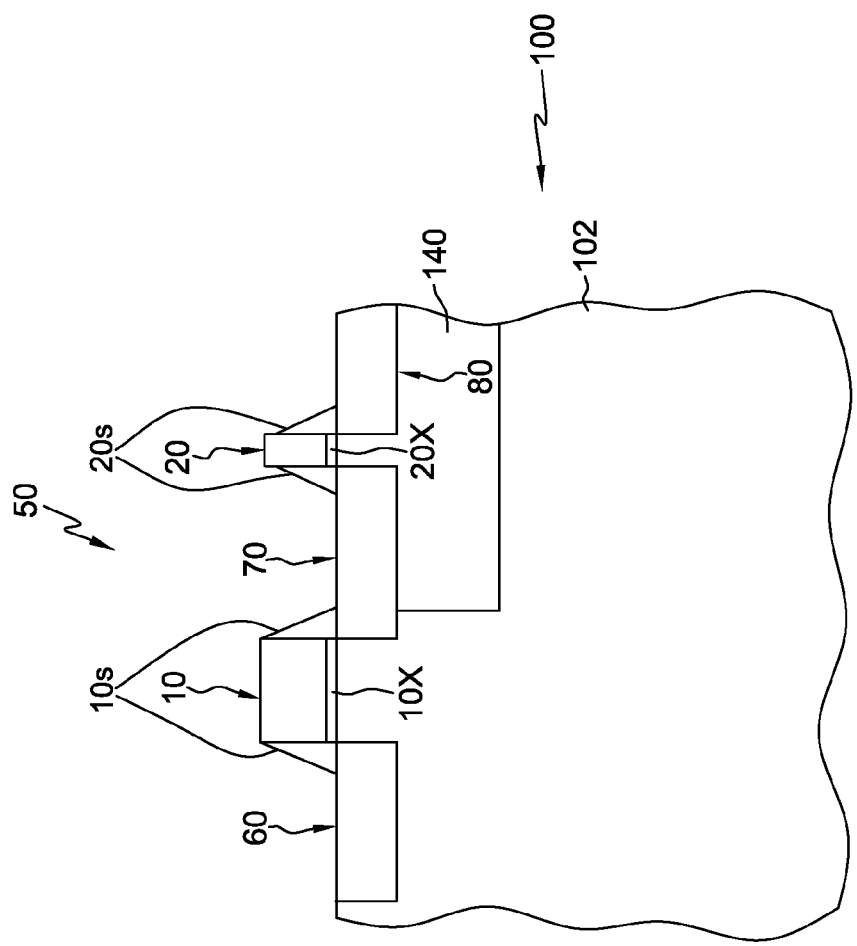
FIG. 6 is a cross sectional view of a semiconductor device having a field effect transistor in an intermediary stage of fabrication.

Referring to FIG. 6, with FET 50 in the state of fabrication depicted in FIG. 5, doped region 140 can be formed. Doped region 140 can be formed using one or more of well doping processes, halos implant doping processes and extensions implant formation processes.

Figure 7:
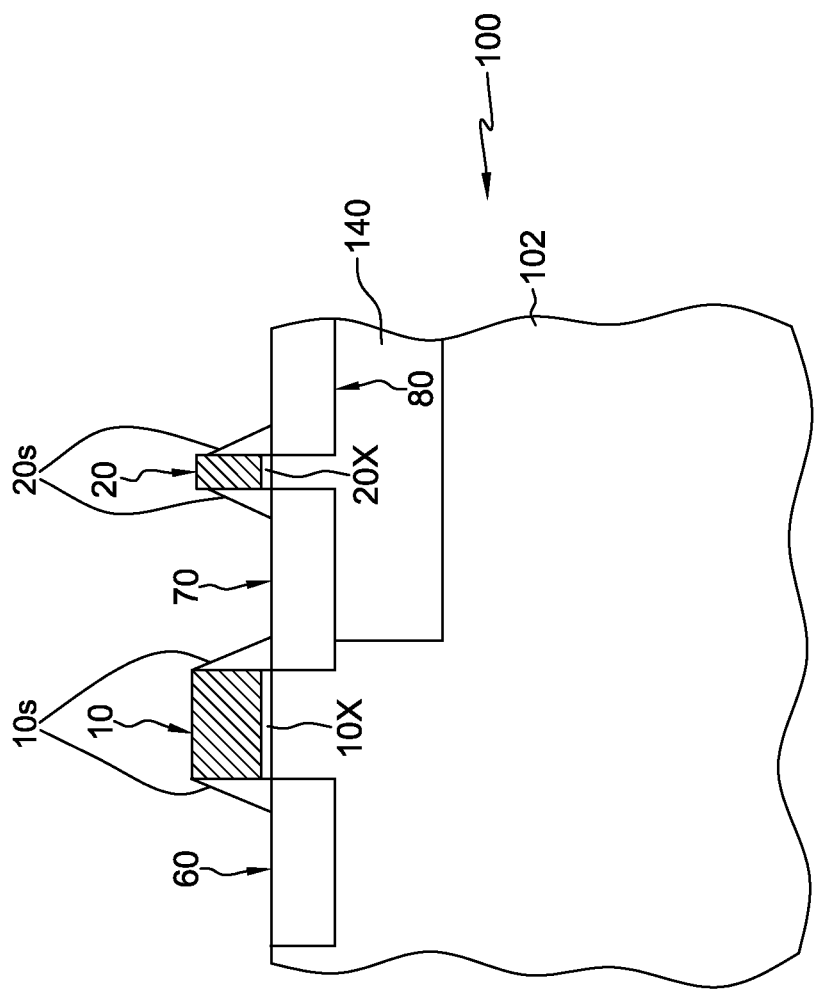
FIG. 7 is a cross sectional view of a semiconductor device having a field effect transistor in an intermediary stage of fabrication.

Referring to FIG. 7, gate 10 and dummy gate 20 can be subject to removal of a sacrificial polysilicon gate and depositing of a metalized gate. Referring to FIG. 7, dummy gate 20 can be subject to removal of a polysilicon gate and depositing of a metal gate. However, because dummy gate 20 in one embodiment performs no gating function, it is not necessary to complete fabrication of dummy gate 20 by removal of polysilicon material and depositing of a metalized gate. In a finalized form of FET 50 in one embodiment, dummy gate 20 can remain in a polysilicon sacrificial gate form.

Figure 8:
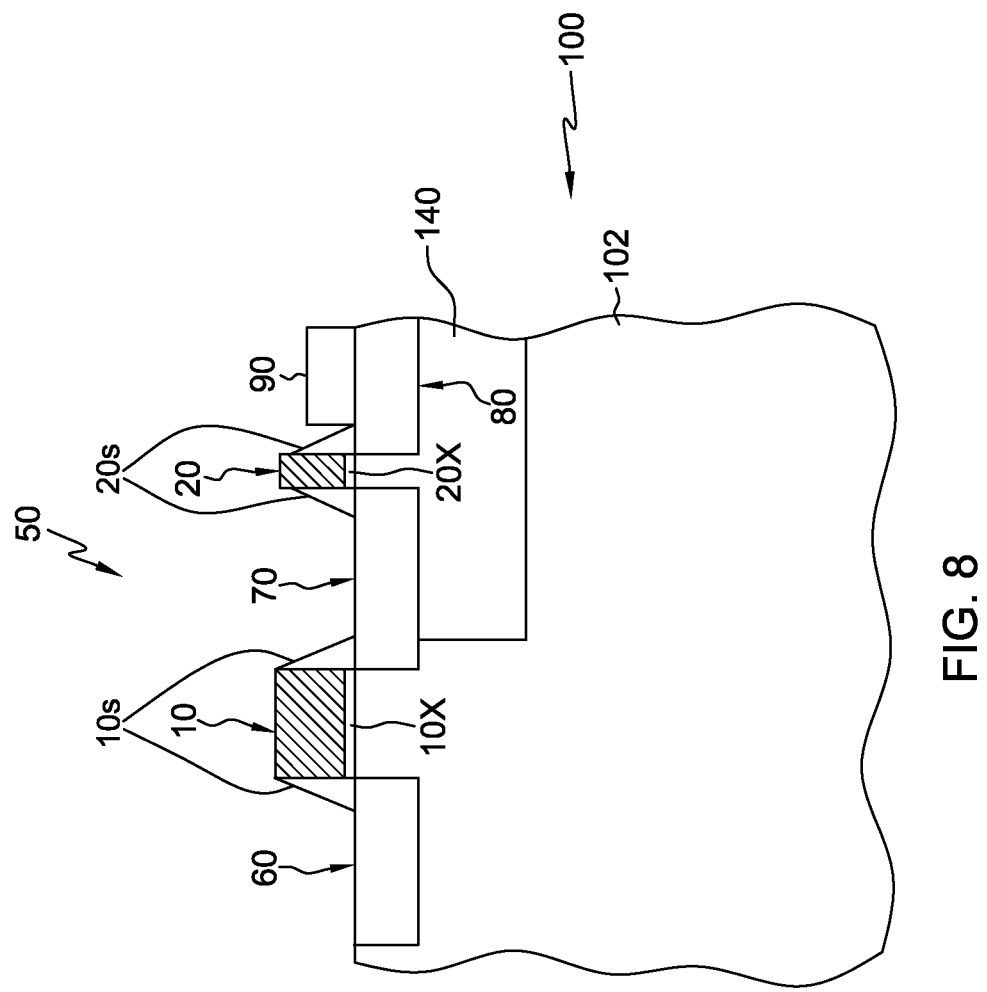
FIG. 8 is a cross sectional view of a semiconductor device having a field effect transistor.

Referring to FIG. 8, with the FET 50 in the intermediary state of fabrication depicted in FIG. 7, contact 90 can be added to FET 50. Referring to FIG. 8, contact 90 can be deposited on second drain diffusion 80 that is spaced apart from gate 10 so that localization of current in proximity with gate 10 during a current surge can be avoided. Contact 90 can be formed to be aligned with second drain diffusion region 80 as set forth in FIG. 8. Contact 90 can be configured for connection to a core circuit I/O contact. During normal operation of a core circuit, a control operating voltage can be applied to contact 90. During an ESD event, an ESD voltage can be applied to contact 90.

Figure 9:
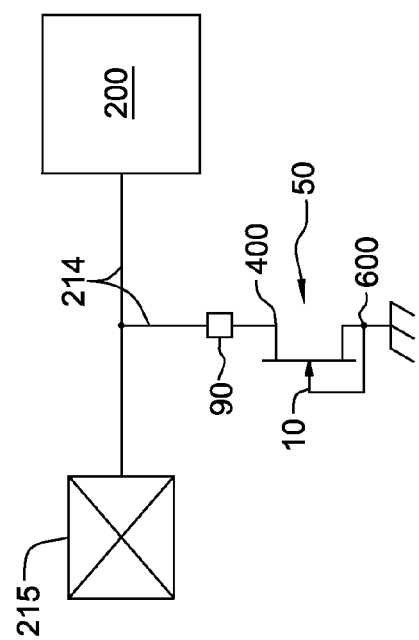
FIG. 9 is a circuit diagram illustrating a FET operating as a protection device for protecting a core circuit.

FET 50 as set forth in FIGS. 1-8 can be employed as an ESD protection device for protection of a core circuit 200 as is set forth in FIG. 9. A circuit diagram showing FET 50 protecting a core circuit 200 is set forth in FIG. 9. As shown in FIG. 9, a core circuit I/O contact 215 can be electrically connected to core circuit 200 via tracing structure 214, and contact 90 can be electrically connected to core circuit I/O contact 215 and core circuit 200 via tracing structure 214. Contact 90 can be electrically connected to drain 400 of FET 50. Gate 10 and source 600 can be electrically connected to ground as shown in FIG. 9.

During an ESD event, a charge can be incident on contact 90, and can be present at high voltage levels (e.g., more than 100V). However, FET 50 configured as an ESD protection device provides a protection function to core circuit 200. More specifically, FET 50 can provide voltage clamping to limit a level of voltage that is present at core circuit 200.

Figure 10:
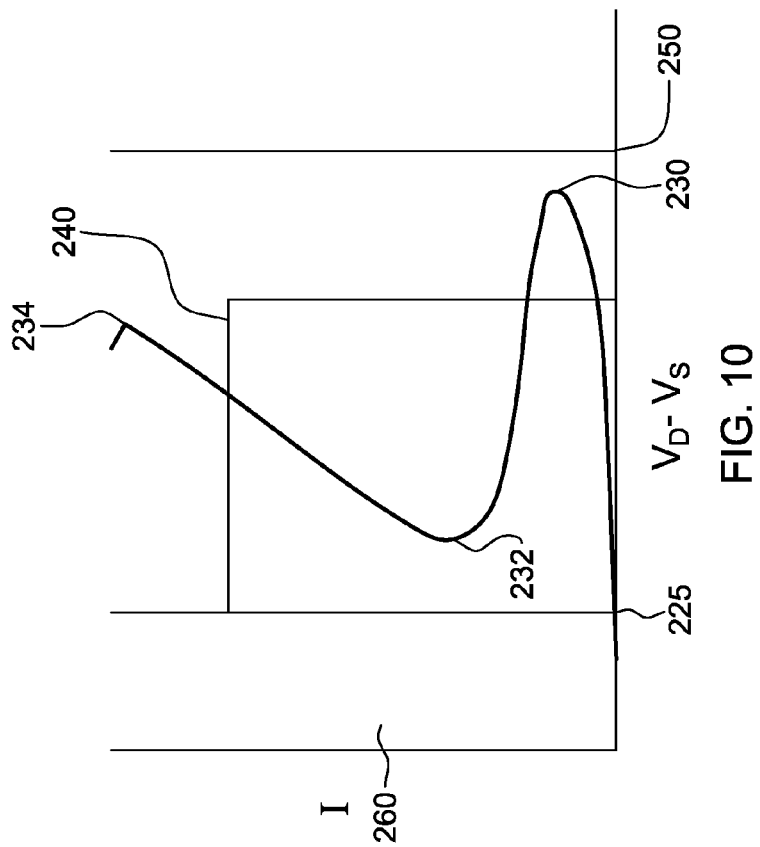
FIG. 10 is a voltage level diagram illustrating operations of a FET operating as a protection device for protecting a core circuit.

FET 50 when operating to provide ESD protection can exhibit snapback mode voltage characteristics as shown in FIG. 10. FET 50 can include an operating voltage 225, a triggering voltage 230, a holding voltage 232, a second breakdown voltage 234, and an oxide breakdown voltage 250. When normal operating signals (e.g. between 0V and 1V are presented to FET 50) FET 50 operates in the IC operating area 260, below operating voltage 225. FET can be configured so that during an ESD event, FET 50 can operate in a protected region (window) 240 wherein a voltage drop across FET 50 is between holding voltage 232 and second breakdown voltage 234 to clamp a voltage applied to core circuit 200 and to thereby prevent high (e.g. 100V plus voltages) from reaching core circuit 200.

FET 50 can be featured for increased reliability during ESD events. FET 50 can include an increased spacing distance between gate 10 and contact 90, which can reduce a risk of localized current surges in proximity to gate 10, reduce a risk of harmful voltages on gate 10 resulting from capacitive coupling and can increase a resistance of a defined drain (drain junction) including doped diffusion regions and doped region 140 to reduce an expected maximum current level through FET 50 during an ESD event. Drain 400 as set forth herein can define an extended drain ESD protection device and can provide ESD ballasting so that an ESD event voltage drop across drain 400 is increased and correspondingly decreased across substrate 102. Providing ESD ballasting, drain 400 as set forth herein in various embodiments can reduce a current surge through substrate 102 during an ESD event, and accordingly can reduce a risk of thermal damage to substrate 102 and materials in thermal communication with substrate 102.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A field effect transistor configured as an ESD protection device, said field effect transistor comprising:
    a semiconductor substrate;
    a gate formed on the substrate;
    a dummy gate formed on the substrate spaced apart from the gate;
    a source diffusion region formed in the substrate adjacent a first end of the gate;
    a first drain diffusion region formed in the substrate, the first drain diffusion region disposed intermediate of the gate and the dummy gate and adjacent to a second end of the gate and a first end of the dummy gate;
    a second drain diffusion region formed in the substrate, the second drain diffusion region spaced apart from the first drain diffusion region; and
    a contact electrically connected to the second drain diffusion region,
    wherein a non-doped region of the substrate extends between the source diffusion region and the first drain diffusion region below the gate.

2. The field effect transistor of claim 1, wherein the dummy gate includes a first end and a second end, the first drain diffusion region being disposed adjacent the first end, the second drain diffusion region being disposed adjacent the second end.

3. The field effect transistor of claim 1, wherein the field effect transistor includes an arrangement of an additional drain diffusion region and an additional dummy gate, the arrangement having a first end and a second end, the first end disposed adjacent the dummy gate, the second end disposed adjacent the first drain diffusion region.

4. The field effect transistor of claim 1, wherein the field effect transistor includes an arrangement of a plurality of additional drain diffusion regions and a plurality of additional dummy gates, each of the plurality of additional drain diffusion regions being disposed adjacent to one additional dummy gate of the plurality of additional dummy gates, the arrangement having a first end and a second end, the first end disposed adjacent the dummy gate, the second end disposed adjacent the second drain diffusion region.

5. The field effect transistor of claim 1, wherein a source including the source diffusion region is connected to ground.

6. The field effect transistor of claim 1, wherein there is formed in the substrate a doped region merging the second diffusion region and the first drain diffusion region, the doped region having a polarity in common with the source diffusion region, the first drain diffusion region, and the second drain diffusion region.

7. The field effect transistor of claim 6, wherein the doped region includes a well doping area.

8. The field effect transistor of claim 6, wherein the doped region includes a halos implant doping area.

9. The field effect transistor of claim 6, wherein the doped region includes an extensions implant doping area.

10. The field effect transistor of claim 6, wherein the source diffusion region and the second drain diffusion region include a common bottom elevation and wherein the doped region includes a bottom elevation below the common bottom elevation.

11. The field effect transistor of claim 1, wherein the second drain diffusion region is a raised diffusion region having an epitaxial growth formation.

12. The field effect transistor of claim 1, wherein the contact is aligned to the second drain diffusion region.

13. The field effect transistor of claim 1, wherein the second drain diffusion region is disposed adjacent to a second end of the dummy gate.

14. The field effect transistor of claim 13, wherein the source diffusion region, the first drain diffusion region and the second diffusion region comprise N doped diffusion regions.

15. The field effect transistor of claim 1, wherein the source diffusion region is contiguous to the substrate.

16. The field effect transistor of claim 1, further comprising a first spacer extending from the first end of the gate and over an upper surface of the source diffusion region, and a second spacer extending from the second end of the gate and over an upper surface of the first drain diffusion region.

17. The field effect transistor of claim 1, further comprising a third spacer extending from the first end of the dummy gate and over the upper surface of the first drain diffusion region, and a fourth spacer extending from a second end of the dummy gate and over an upper surface of the second drain diffusion region.

18. The field effect transistor of claim 1, wherein the source diffusion region is aligned with the first end of the gate.

19. The field effect transistor of claim 1, wherein the first drain diffusion region is aligned with the second end of the gate and the first end of the dummy gate.

20. The field effect transistor of claim 1, wherein the second drain diffusion region is aligned with a second end of the dummy gate.

* * * * *